(12) United States Patent
Heijmans et al.

(10) Patent No.: US 9,201,240 B2
(45) Date of Patent: Dec. 1, 2015

(54) POSITIONING SYSTEM

(71) Applicant: The Commonwealth of Australia as represented by the Department of Industry, Eastwood, New South Wales (AU)

(72) Inventors: Jeroen Heijmans, Newport (AU); Will Saunders, London (GB); James Gilbert, McMahons Point (AU)

(73) Assignee: The Commonwealth of Australia as represented by the Department of Industry (AU)

( * ) Notice: Subject to any disclaimer, the term of this patent is extended or adjusted under 35 U.S.C. 154(b) by 547 days.

(21) Appl. No.: 13/630,964

(22) Filed: Sep. 28, 2012

(65) Prior Publication Data

US 2013/0084049 A1 Apr. 4, 2013

(30) Foreign Application Priority Data

Sep. 30, 2011 (AU) .................. 2011904058

(51) Int. Cl.
*G02B 6/00* (2006.01)
*G02B 26/10* (2006.01)
*G02B 7/00* (2006.01)
*G02B 23/16* (2006.01)
(Continued)

(52) U.S. Cl.
CPC .............. *G02B 26/103* (2013.01); *G01J 3/0218* (2013.01); *G02B 7/005* (2013.01); *G02B 23/16* (2013.01); *H01L 41/092* (2013.01); *H02N 2/101* (2013.01); *G01J 2003/065* (2013.01); *G01J 2003/069* (2013.01); *G02B 6/3504* (2013.01); *G02B 6/3508* (2013.01); *G02B 6/3578* (2013.01); *G02B 6/4298* (2013.01)

(58) Field of Classification Search
None
See application file for complete search history.

(56) References Cited

U.S. PATENT DOCUMENTS 6,059,250 A 5/2000 Reuter et al.
7,505,654 B2 * 3/2009 Demissy et al. ............. 385/52

FOREIGN PATENT DOCUMENTS

EP 0831351 A2 3/1998
JP 2000-352622 A 12/2000
(Continued)

OTHER PUBLICATIONS

Australian Application Serial No. 2012232975, Examination Report No. 1 mailed Aug. 12, 2013, 5 pgs.
(Continued)

*Primary Examiner* — Hemang Sanghavi
(74) *Attorney, Agent, or Firm* — Schwegman Lundberg & Woessner, P.A.

(57) ABSTRACT

The present invention relates to a method and system for fiber positioning in wide-field astronomy. In one form the method and system of the present invention relate to anchoring fiber end points adjacent or against the field plate of a telescope. In one embodiment the positioning system for anchoring a fiber end point at a location on a telescope field plate collocated with a telescope focal plane, the positioning system comprising a piezoelectric positioning device for positioning the fiber end point, the positioning device comprising a chamber having an opening, the opening lying against the field plate in use defining a substantially enclosed volume inside the chamber, a pump for reducing pressure inside the enclosed volume; and a path connecting the pump and the enclosed volume so that, in use, the pump effects a reduction in pressure in the chamber thereby anchoring the fiber end point on the field plate.

18 Claims, 18 Drawing Sheets

(51) Int. Cl.

| | | |
|---|---|---|
| *G01J 3/02* | (2006.01) | |
| *H01L 41/09* | (2006.01) | |
| *H02N 2/10* | (2006.01) | |
| *G01J 3/06* | (2006.01) | |
| *G02B 6/35* | (2006.01) | |
| *G02B 6/42* | (2006.01) | |

(56) References Cited

FOREIGN PATENT DOCUMENTS

| JP | 2003257821 A * | 9/2003 |
|---|---|---|
| WO | WO-02/46825 A1 | 6/2002 |
| WO | WO-2008/011580 A2 | 1/2008 |

OTHER PUBLICATIONS

Australian Application Serial No. 2012232975, Examination Report No. 2 mailed Jun. 2, 2014, 4 pgs.
Dalton, G. B., et al., "Fibre positioning revisted: the use of an off-the-shelf assembly robot for OPTOMOS-EVE", *Proc. of SPIE*, vol. 7739, *Modern Technologies in Space- and Ground-based Telescopes and Instrumentation*, (2010), 7 pgs.
Goodwin, M., et al., "Starbugs: focal plane fiber positioning technology", *Proc. of SPIE*, vol. 7739, *Modern Technologies in Space- and Ground-based Telescopes and Instrumentation*, (2010), 77391E-1-77391E-12.
Hu, H., et al., "New Type Optical Fiber Positioning Unit Device for LAMOST", *Proc. of SPIE*, vol. 4837, *Large Ground-based Telescopes*, (2003), 8 pgs.
Schlegel, D., et al., "LBNL Fiber Positioners for Wide Field Spectroscopy", *Proc. of SPIE*, vol. 7018, *Advanced Optical and Mechanical Technologies in Telescopes and Instrumentation*, (2008), 5 pgs.
Australian Application Serial No. 2012232975, Notice of Acceptance mailed Aug. 26, 2014, 26 pgs.
Australian Application Serial No. 2012232975, Response filed Mar. 24, 2014 to Examination Report No. 1 mailed Aug. 12, 2013, 21 pgs.
Australian Application Serial No. 2012232975, Response filed Aug. 8, 2014 to Examination Report No. 2 mailed Jun. 2, 2014, 9 pgs.
European Application No. 12186644.6, European Search Report mailed Aug. 18, 2014, 11 pgs.
McGrath, Andrew, et al., "Deployable Payloads with Starbug", Proc. SPIE 6273 (2006), 12 pgs.

* cited by examiner

POSITIONING SYSTEM

CLAIM OF PRIORITY

This application claims the benefit of priority, under 35 U.S.C. §119(a)-(d), of Australian Patent Application Serial No. 2011904058, entitled "POSITIONING SYSTEM," filed on Sep. 30, 2011, the benefit of priority of which is claimed hereby, and which is incorporated by reference herein in its entirety.

FIELD OF THE INVENTION

The present invention relates to a method and system for fibre positioning in wide-field astronomy. In one form the method and system of the present invention relate to anchoring fibre end points adjacent or against the field plate of a telescope.

BACKGROUND OF THE INVENTION

Large optical telescopes are used to view astronomical objects such as stars and galaxies and to collect data for measurement and scientific analysis. A schematic representation of a telescope 100 is shown in FIG. 1 where light from astronomical objects such as stars 102 is reflected in a mirror 104, and the reflected light 106 is focused on the telescope's focal plane where a field plate 108 is positioned. This reflected light 106 is captured by optical fibres 110 and fed to one or more spectrographs 112 for data measurement and analysis. Typically hundreds of fibres are used. The collecting end points 114 of the respective fibres are positioned at the field plate 108 with sufficient precision so that reflected light from specific astronomical objects can be collected. Therefore, for each different field of stars and galaxies all the fibres need to be repositioned appropriately.

One type of fibre positioning technology used to position the fibres on the field plate is shown in FIG. 2A. Multiple cassettes 202 are situated around a metal field plate 204 of the telescope and each cassette 202 houses a number of optical fibres (typically 10). The cassettes 202 use spring loaded retractors to keep the fibres straight when they are placed on the field plate 204. Each fibre has a fibre end point 206 and these end points 206 are positioned on the field plate 204 by a pick and place machine 208, such as a 2 Degree Field (2 dF) robotic fibre positioner. The 2 dF positioner picks up one end point 206 at a time and places it in the correct position and the fibre end points are then anchored to the metallic field plate 204 magnetically. This positioning process is complex, time consuming and reduces the amount of observing time available to the astronomer because of how long it takes to position the fibre end points.

Referring to FIG. 2B, each fibre end point 206 is connected to a magnet 210 that is used to anchor the end point to the metallic field plate 204. In order for each fibre 212 to capture the light reflected from the telescope's mirror (indicated by arrow 214) each fibre end point 206 also requires a prism 216 that bends the reflected light into the fibre. The construction of such a fibre end point is therefore quite bulky, requiring both a magnet and a prism.

Large telescopes that have several large multi-object spectrographs result in large slit-lengths so that very large numbers of fibres are required to fill the slits. Because of the use of cassettes as well as the time the positioning takes the number of fibres that can be accommodated is limited. Other problems include the spring loaded configuration resulting in unwanted forces exerted on the positioner and fibres crossing the focal plane when the end points are positioned. As the number of fibres increases, these problems also increase.

Because of the many disadvantages associated with existing positioning methods it is desirable to have an alternative way of positioning and anchoring optical fibres in large telescopes.

Reference to any prior art in the specification is not, and should not be taken as, an acknowledgment or any form of suggestion that this prior art forms part of the common general knowledge in Australia or any other jurisdiction or that this prior art could reasonably be expected to be ascertained, understood and regarded as relevant by a person skilled in the art.

SUMMARY OF THE INVENTION

In one aspect there is provided a positioning system for anchoring a fibre end point at a location on a telescope field plate collocated with a telescope focal plane, the positioning system comprising: a piezoelectric positioning device for positioning the fibre end point, the positioning device comprising a chamber comprising an opening, the opening lying against the field plate in use defining a substantially enclosed volume inside the chamber; a pump for reducing pressure inside the enclosed volume; and a path connecting the pump and the enclosed volume so that, in use, the pump effects a reduction in pressure in the chamber thereby anchoring the fibre end point on the field plate.

The piezoelectric positioning device may comprise two concentric piezoelectric cylinders and the chamber lies between the two cylinders. The piezoelectric positioning device may comprise one piezoelectric cylinder and the chamber lies within a wall of said cylinder.

The pump may comprise a vacuum pump for removing gas molecules from the enclosed volume thereby reducing pressure in the chamber. The pump may further comprise a vacuum buffer functionally located between the vacuum pump and the path so that the path interfaces with the pump via the vacuum buffer.

The path may comprise tubing leading from the pump into the enclosed volume.

The pump may comprise: a heat element for heating air in the chamber; a first one way valve; and a second one way valve; wherein, in use, heating and subsequently cooling the heat element enables a movement of air through the first and second valves thereby reducing pressure in the chamber.

In another aspect there is provided a positioning system for anchoring a fibre end point at a location on a telescope field plate collocated with a telescope focal plane, the positioning system comprising: a plurality of piezoelectric positioning devices, respective devices comprising a chamber comprising an opening, the opening lying against the field plate in use defining a substantially enclosed volume inside the chamber; a pump for reducing pressure inside the enclosed volume; and a path connecting the pump and the enclosed volume so that, in use, the pump effects a reduction in pressure in the chamber thereby anchoring the fibre end point on the field plate.

The positioning system may also comprise a control system for controlling movement of the positioning devices. The control system may be used to control the movement of more than one of the positioning devices substantially simultaneously.

In another aspect there is provided a method for anchoring a fibre end point at a location on a telescope field plate collocated with a telescope focal plane, the method comprising: positioning a fibre positioning device against the field plate;

and reducing pressure in an enclosed volume inside the fibre positioning device thereby anchoring the fibre end point against the field plate.

The method may further comprise the step of maintaining a reduced pressure in the enclosed volume when repositioning the fibre end point so that the fibre end point remains against the field plate during repositioning.

In another aspect there is provided a self-motile positioning device for locating an optical sensor assembly at a location on a telescope field plate, the device comprising: an input to the optical sensor assembly; piezoelectric positioning means to move the positioning device; a housing comprising the input and the piezoelectric positioning means, the housing comprising a chamber with an opening that in use is held against the field plate to define an enclosed volume; suction means to reduce a pressure in the chamber and thereby hold the positioning device against the field plate.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

DETAILED DESCRIPTION OF THE EMBODIMENTS

Figure 3:
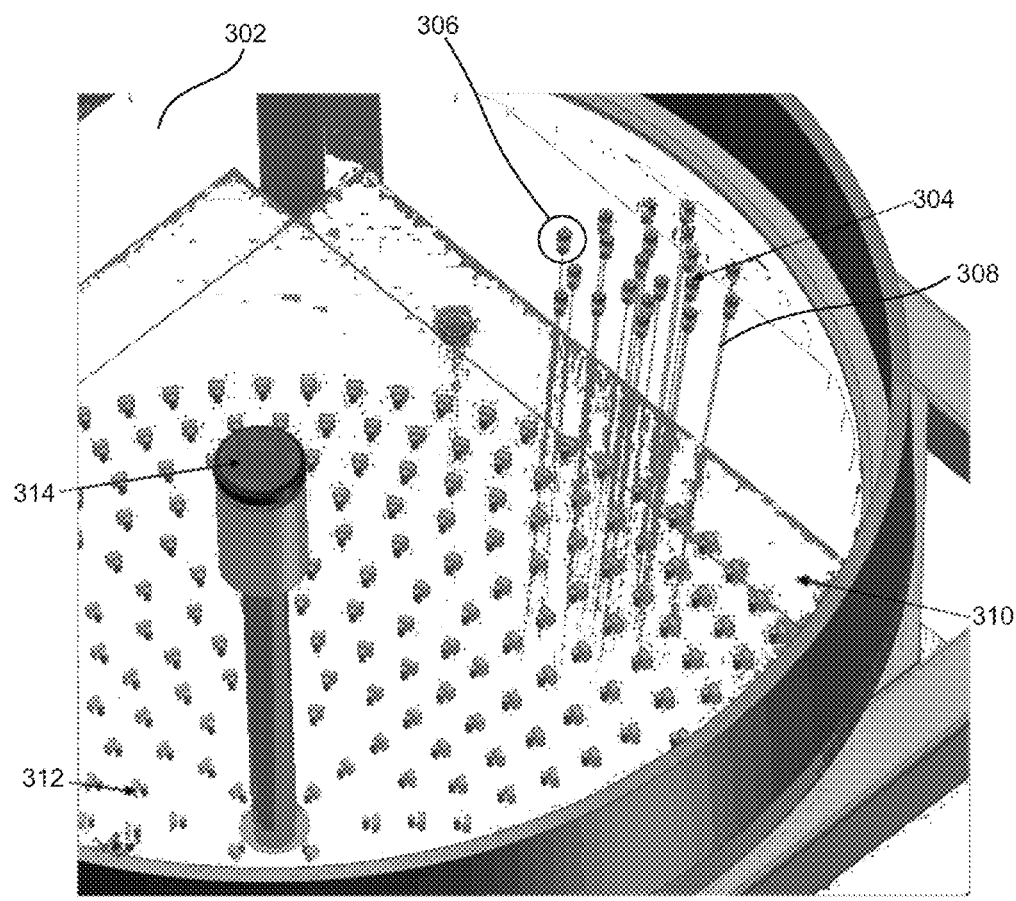
FIG. 3 is a partial perspective view of the field plate of a large telescope with self-motile devices used for positioning the optical fibre.

Described herein are methods and systems for fibre positioning and anchoring based on individual self-motile positioning devices, each associated with a fibre end point to be positioned on a field plate. Referring to FIG. 3 a field plate 302 of a telescope is shown where the field plate 302 consists of glass or another suitable transparent rigid material such as plastic.

The required transparent dome used for the field plate 302 does not need to be made to high precision, and can, for example, be slumped from commercially available glass sheets. Furthermore, the field plate need not be in the shape of a dome but may be substantially planar.

Fibre feeds are typically provided for a number of spectrographs and/or spectrograph types. A large number of "deployable fibre units" (DFUs) are fed to each spectrograph. DFUs can include anything from a single to hundreds of fibres (e.g. 900) with individual fibre diameters ranging from 50 micrometers to several hundred micrometers, and providing a variety of aperture geometries such as single aperture and image-slicing multiple apertures.

The fibres that are placed by the devices and lead to the spectrographs of the telescope typically have a 250 µm outer diameter depending on the telescope optical magnification and the size of objects under study. A set of fibres forms a single module which terminates in a connectorized plug. The spectrographs are fed via fibre slits, each with its own connectorized socket. The modules are then interchangeable between the spectrographs, and modules can be added, upgraded or replaced as desired. Alternatively specific DFUs match a specific spectrograph. Some DFUs are even split up between spectrographs to study one object with different spectrographs having, for example, different wavelengths and/or resolution.

Fibre end points 304 are moved along and anchored against the field plate 302 by positioning devices 306. The optical fibres 308 extend from their respective end points 304 to a harness plate 310 where the fibres are attached to connectors 312 before being bundled into modules and fed to the spectrographs of the telescope. The field plate 302 is supported at a fixed distance from the harness plate 310 by a field plate support post 314.

Apart from moving and anchoring fibre end points, the positioning and anchoring systems and methods as described herein are used for locating optical sensor assemblies which may include a fibre end point on its own, a lens or lens assembly and/or an optical sensor such as a photodetector.

Each fibre end point 304 is positioned by a respective positioning device 306 that functions as a self-motile miniature positioning robot. The configuration shown in FIG. 3 provides each positioning device 306 with a "patrol area" to simplify and speed up reconfiguring. The patrol areas overlap and do not significantly limit the available configurations. Because the fibre end points 304 can be moved in parallel, reconfiguration requires much less time than, for example, is required with a pick and place robot like the 2 dF robot where configuration time has a linear dependence on the number of elements deployed and field plate size. The 2 dF robot as shown in FIG. 2A requires in the order of one hour to position 400 fibres on the field plate whereas an equivalent self-motile positioning device may have a typical field configuration time of less than 2 minutes.

Figure 1:
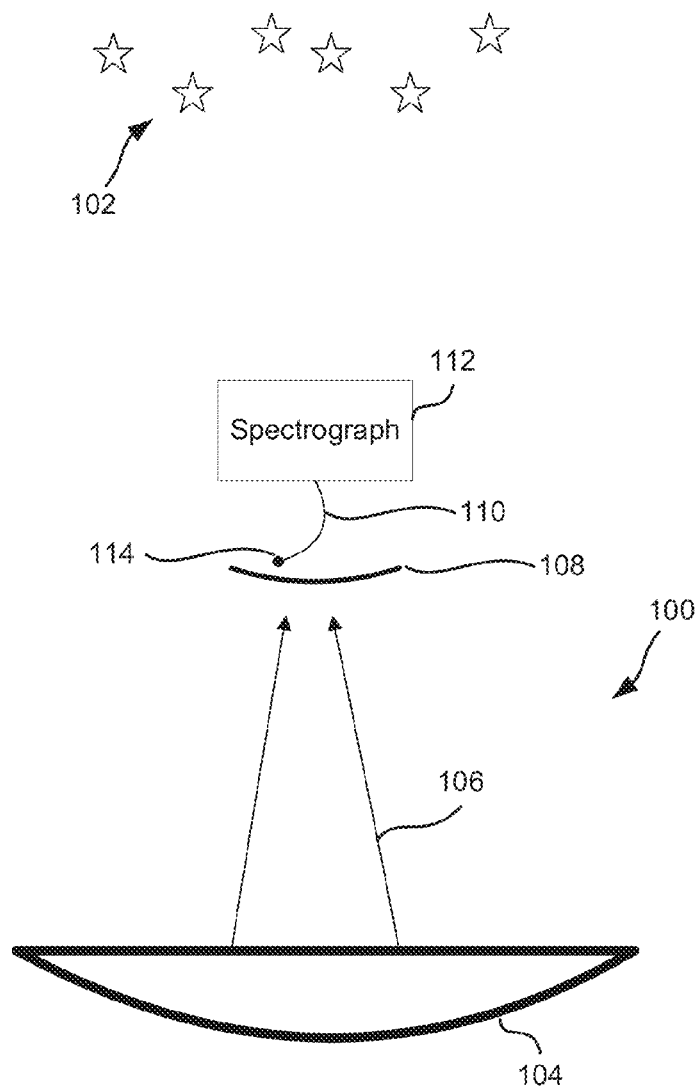
FIG. 1 is a schematic representation of a large telescope.
Figure 2A:
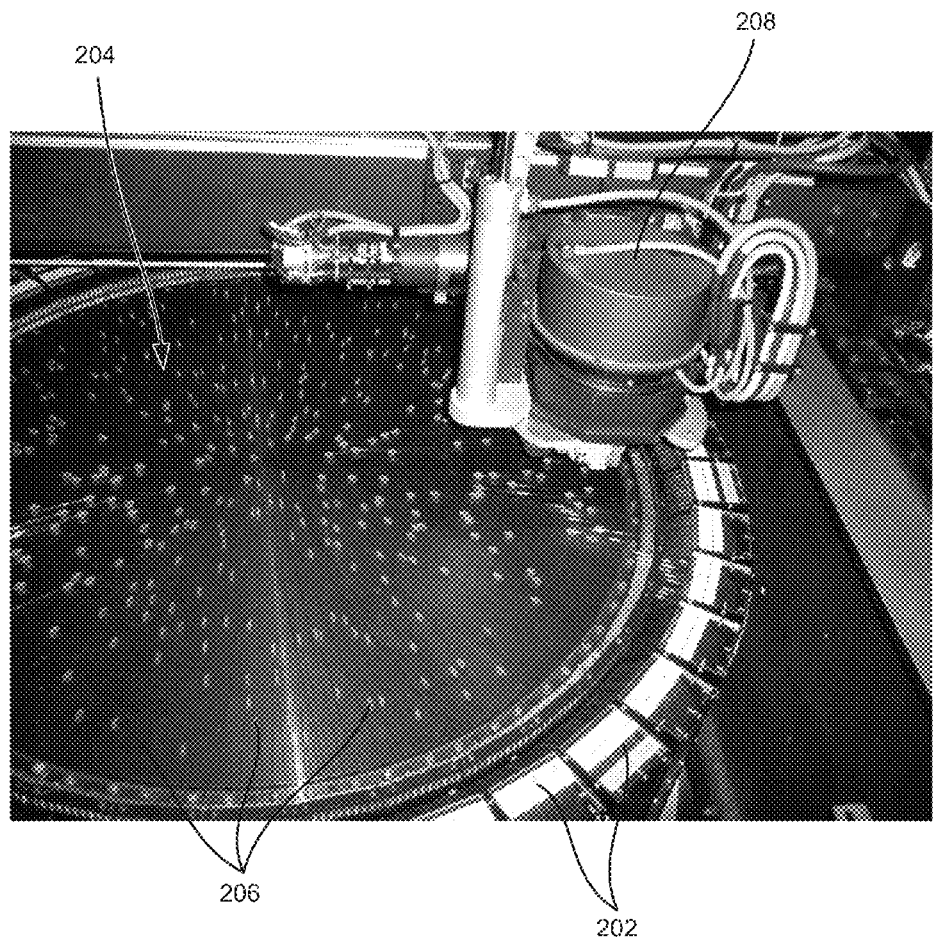
FIG. 2A is a photograph of a pick and place machine positioning optical fibre on the field plate of a telescope.
Figure 2B:
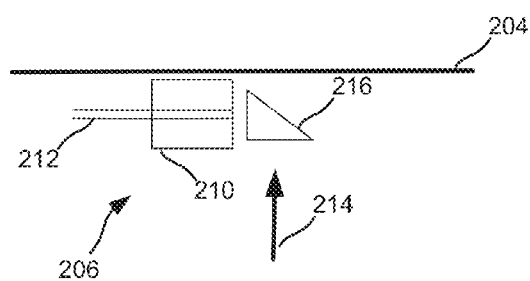
FIG. 2B is a schematic representation of the fibre end point configuration of the fibres positioned in the telescope of FIG. 2A.

The configuration shown in FIG. 3 using self-motile positioning devices has a number of further advantages, including:

The fibres are positioned on the opposite side of the field plate than in the configuration of FIG. 2A. This inverted 'hanging' mode eliminates fibres crossing the field plate and fibre retractors that inhibit motion (target allocation) and device numbers.

The separation distance between the fibre end points can be smaller because the light travels in a straight line from the mirror to the fibre input without the fibre end point requiring a prism to bend the light into the fibre as is the case with the cassette-originating fibres. This means the physical size of the positioning device enables a spacing between positioning devices of 5-20 mm Because there are no retractors and no fibres crossing the focal plane very large numbers of fibre positions can be deployed.

Because a pick and place robot is not used the instrument weight is significantly reduced and the instrument can be operated in a limited space.

The self-motile positioning devices allow great flexibility such as the ability for micro-tracking operation, including correcting the intra-field distortion effects of a changing atmospheric differential refraction as well as image gyration or pupil rotation during the observation, which is further described below.

The self-motile positioning devices have increased reliability due to fewer single-point system failures.

Figure 4A:
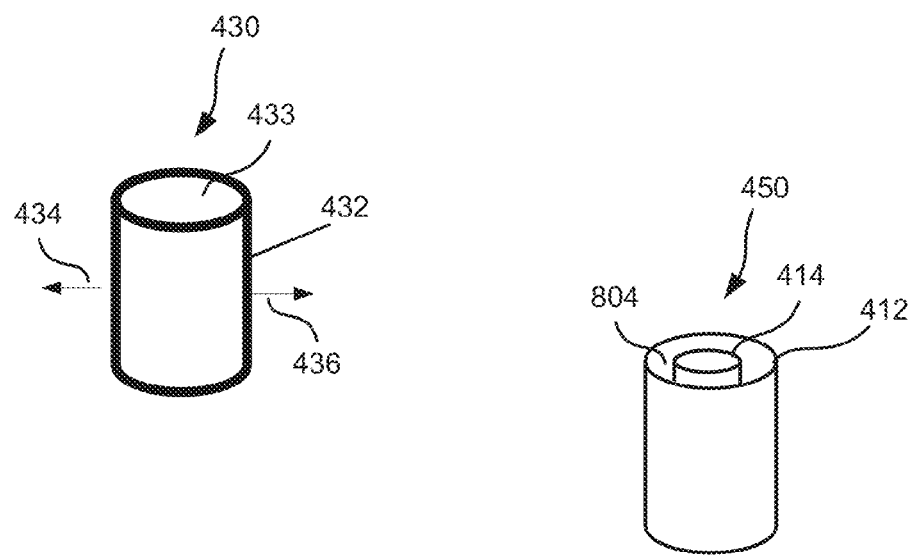
FIG. 4A is a schematic diagram of two different configurations of self-motile positioning devices.

In one arrangement, the positioning devices 306 are able to move the fibre end points 304 because they consist of a piezoelectric device that changes shape depending on (i) the polarity of an applied electric field and (ii) the material specifications of the piezoelectric material used, thereby generating mechanical movement with the application of electric waveforms. Referring to FIG. 4A, in one configuration the device 430 consists of a single piezo tube 432 with more than one but logically less than or equal to four electrodes to allow radial bending or flexing in the directions indicated by arrows 434 and 436 and in the directions normal to the arrows. The device can thus move in an x-y plane (parallel to the field plate) or rotate about an axis orthogonal to the field plate. The inside of the tube 432 is a chamber 433 that holds the fibre end point, and additionally or alternatively may also hold one or more lenses such as fibre lenses and/or optical sensors (for example photodiodes). The device 430 is able to bend or flex for lateral movement and move the fibre end point, for example using an inertial stick-slip method as described in A. McGrath et al. "Deployable payloads with Starbug," Proc. SPIE 6273 (2006). One or more chambers may be tooled through the wall of the tube 432 to aid in anchoring the device to a field plate as described in more detail below with reference to FIGS. 8 to 10.

In another configuration the device 450 includes two concentric cylinders: an inner cylinder forming an inner wall 414 and an outer cylinder forming an outer wall 412, thereby defining a chamber 804 between the two cylinders. The inner cylinder is used to hold the fibre end point, and additionally or alternatively may also hold one or more lenses such as fibre lenses and/or optical sensors (for example photodiodes).

The positioning devices may alternatively or in addition include a housing that includes a piezoelectric positioning means and also includes a chamber or other enclosed volume used for anchoring the devices.

Figure 4B:
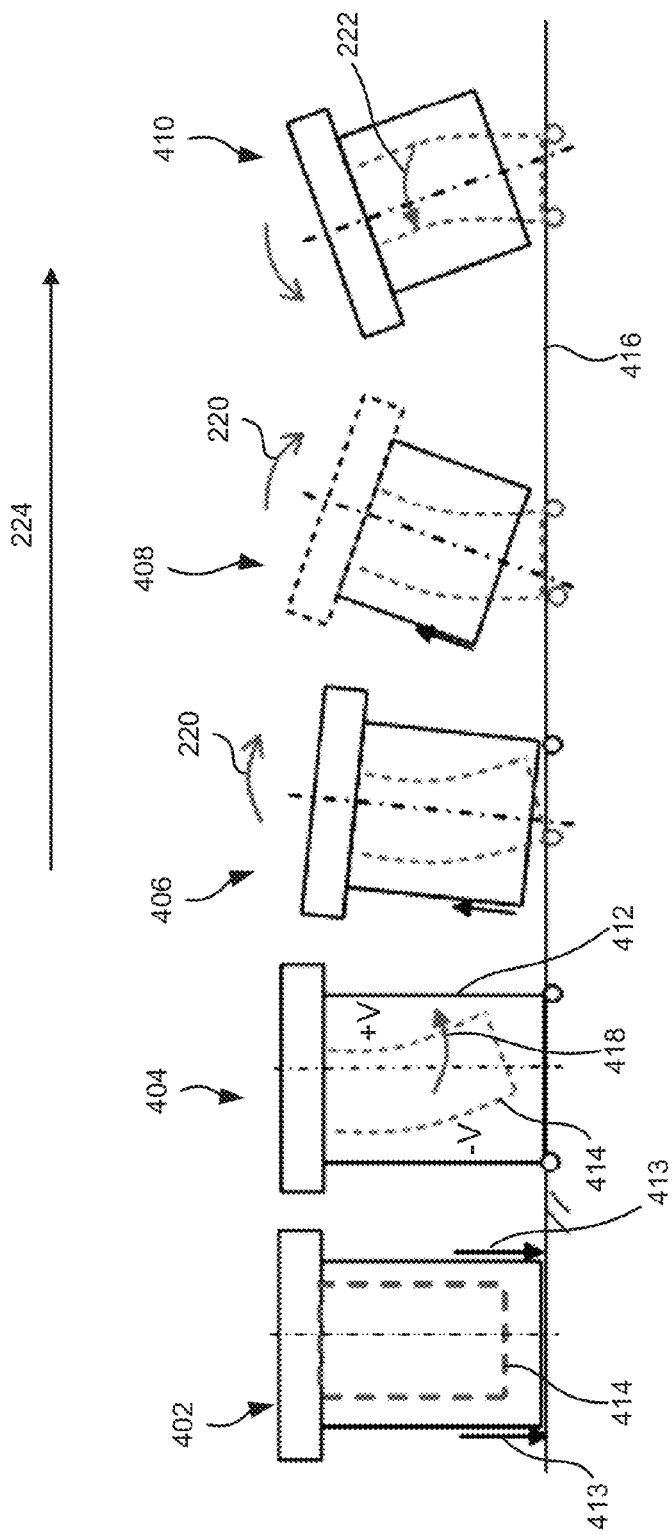
FIG. 4B is a schematic diagram of the consecutive steps resulting in translational movement of one of the self-motile devices shown in FIG. 4A.
Figure 4C:
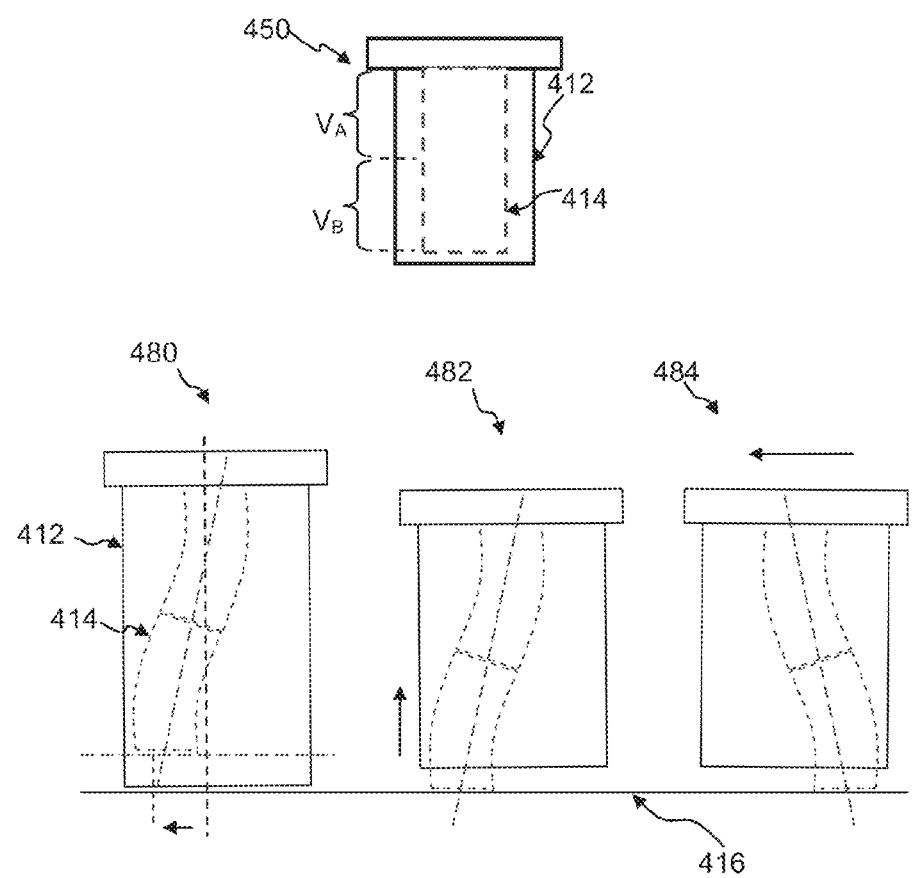
FIG. 4C illustrates another embodiment of the self-motile device in which the inner electrode is divided into an upper electrode and a lower electrode and a schematic diagram of the consecutive steps resulting translational in movement of this embodiment of the self-motile device.

Referring to FIG. 4B, the application of a positive voltage +V across one wall of a piezoelectric ceramic tube 414 causes this wall to contract and the application of a negative voltage −V across the opposite wall causes the opposite wall to expand. A single bending movement can therefore be created by applying different potentials at opposite sides of the tube. Further, a double bending movement can be generated if the electrode of, for example, the inner tube is divided into an upper and lower electrode to which different voltages are applied, as illustrated in FIG. 4C where a voltage $V_A$ is applied to the upper electrode and a voltage $V_B$ is applied to the lower electrode. This keeps the end surface of the device 450 in parallel with the field plate, allowing movement without causing the positioner to tilt. For example, in step 480, the upper electrode and the lower electrodes have an equal but opposite voltage respectively applied so that the inner tube 412 exhibits a S-shape. In step 482, the outer tube 412 is reduced in length by, for example, applying the same positive voltage V+ to both walls of the outer tube 412, which thus contract. The inner tube 414 bent into a S-shape may therefore come into contact with and rest on the field plate 416. In step 484, the voltages applied to the upper electrode and the lower electrode are then reversed, causing the inner tube 414 to bend in a reverse-S shape and causing the device 450 to translate. To continue moving the device 450, the outer tube 412 may first be extended in length by, for example, applying the same negative voltage V− (and thus expand) both walls of the outer tube 412, so that the outer tube 412 rests on the field plate 416. Steps 480 to 484 may then be repeated to continue the movement of the device 450.

The displacement of the tube depends on the magnitude of the voltage applied and is of the order of ten micrometers per several hundred volts. The movement of device 402 is shown in steps 404, 406, 408 and 410 in FIG. 4B. Device 402 includes two co-axial piezoelectric cylinders or tubes: an outer tube 412 and an inner tube 414. By driving the device's two co-axial tubes with specific alternating periodic waveforms, translational stepping motion in the x and y directions can be achieved. For translational stepping, first the outer tube 412 extends in the direction of arrows 413 so that the inner tube 414 is suspended away from the field plate 416. Then at step 404 the inner tube 414 bends to the right as indicated by arrow 418, followed by the outer tube 412 contracting at step 406 so that the device 402 is supported against the field plate 416 by the bent inner tube 414 and tilts towards the right as shown by arrow 220. Finally the inner tube 414 bends to the left as indicated by arrow 222 which propels the device forwards as indicated by arrow 224. This cycle repeats to produce a 'walking' motion.

The typical waveform amplitude is 120 to 200V at a frequency of 100 Hz. Each waveform cycle is a single step of approximately 5 micrometers for a positioner length and diameter of 20 mm and 8 mm respectively, equating a typical velocity of 0.5 mm/s. The velocity can be altered by changing either the frequency of all waveforms or changing the step size by changing the amount of inner tube bending by altering the peak amplitudes of the applied waveforms.

The description above directed to FIG. 4B relates to the translational movement of the positioning device. The device is additionally capable of rotational movement. By driving the device's two co-axial tubes with specific alternating periodic waveforms, rotational stepping motion can be achieved. In particular, the device may be configured for angularly positioning the fibre endpoint to correct for pupil rotation during telescope observation. The axis about which the pupil rotation occurs may be an axis normal to the field plate or focal plane, that is, normal to the plane of translational (x,y) movements.

Figure 4D:
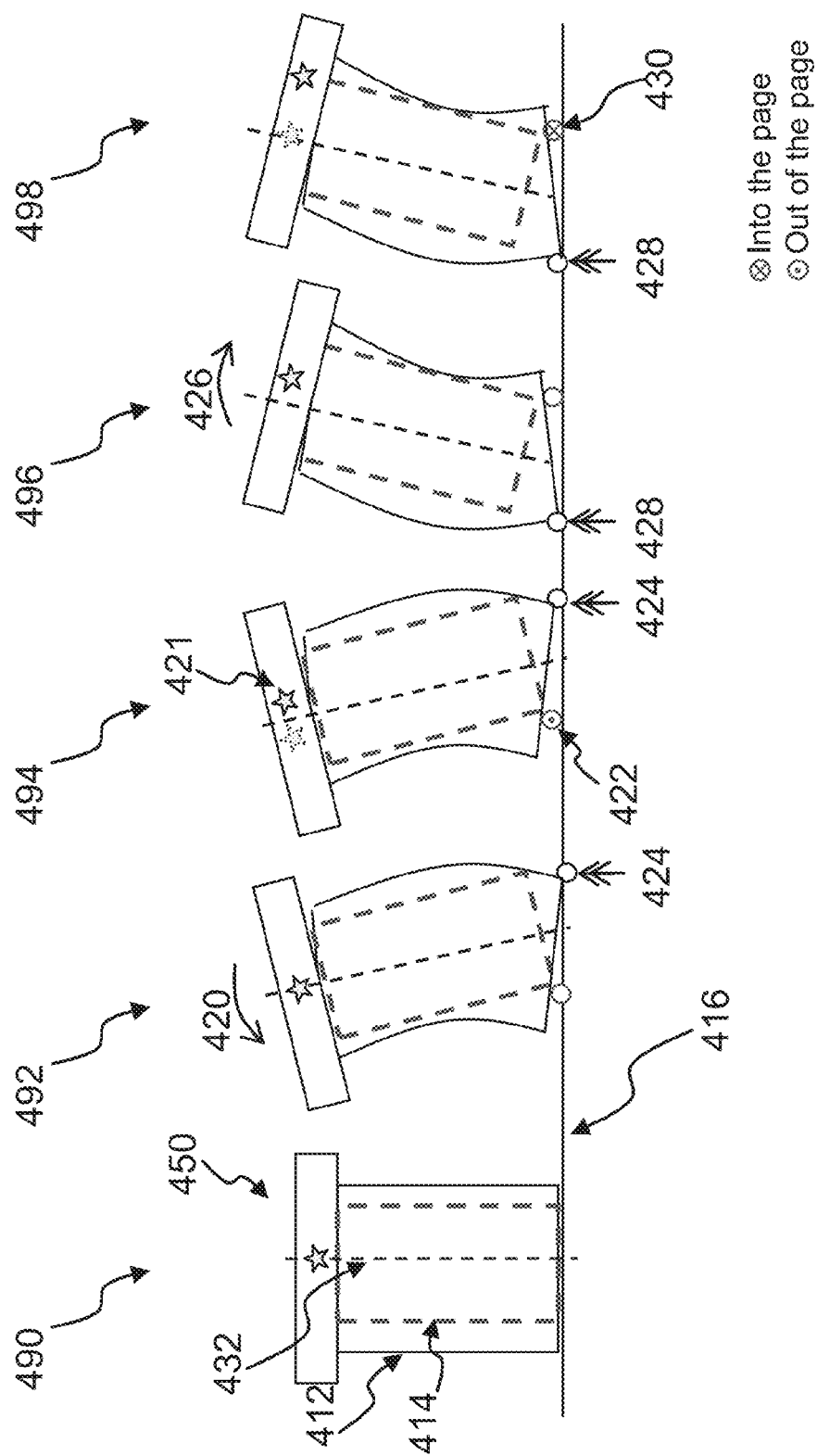
FIG. 4D is a schematic diagram of the consecutive steps resulting in rotation movement of yet another embodiment of the self-motile device.

FIG. 4D shows side views of an embodiment of a positioning device capable of angular positioning on the field plate 416. The series of diagrams in FIG. 4D illustrate various stages or steps 490, 492, 494, 496 and 498 during rotational movement of the device 450. For ease of illustration the device 450 shown in FIG. 4D does not include the double bending movement. The rotational movement may also be obtained with a device divided into upper and lower electrodes as shown in FIG. 4C.

Figure 4E:
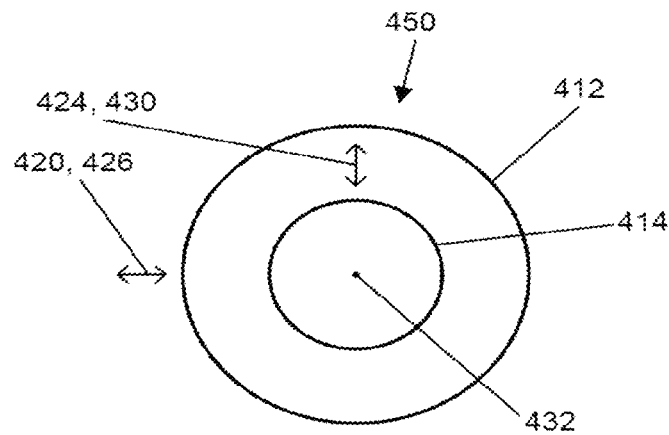
FIG. 4E is a top view of the embodiment of the self-motile device shown in FIG. 4D.

To achieve rotational movement and thereby angular positioning, the device 450 may use a combination of movements of the outer tube 412 and the inner tube 414. At step 492, the device 450 may first bend or flex the outer tube 412 to the left as shown by the arrow 420, so that the whole device 450 is leaning towards the left and pivoting on a point 424 on the outer rim of the device 450. Next, at step 494, the inner tube 414 bends or flexes in an out-of-the-page direction as shown by symbol ⊙ 422 in such a way that a stepping motion is produced in a direction substantially orthogonal to the direction of bending of the outer tube 412. This causes the device 450 to rotate or turn about the pivoting point 424 on the rim of the outer tube 412. The double-headed vector, for example at point 424, is an indicator of rotation. The star markings ☆ 421, which are displayed for illustration purposes and do not form part of the device 450, illustrate the extent of rotation of the device 450. Then, at step 496, with the outer tube 412 bending or flexing in a substantially opposite direction 426 and at step 498 the inner tube 414 stepping in an into-the-page direction as shown by symbol ⊗ 430, rotation of the device 450 may be continued about a point 428 on the opposite rim of the outer tube 412. By repeating these opposite stepping motions in equal measure, rotation about a virtual rotation axis 432 in the centre of the device 450 can be achieved. Additionally, by controlling the ratio of steps about one side to steps about the opposite side, rotation about any virtual point between the device's centre 432 and the outer rim of the outer tube 412 can be achieved. FIG. 4E also illustrates bending directions 420 and 426 of the outer tube 412 and bending directions 424 and 430 of the inner tube 414 in a top view of the device 450. While the rotational stepping motion described above is performed by the inner tube 414 while the device 450 pivots on the outer tube 412, it should be appreciated that in other embodiments the rotational stepping motion may be performed by the outer tube 412 while the device 450 may pivot on the inner tube 414.

Figure 4F:
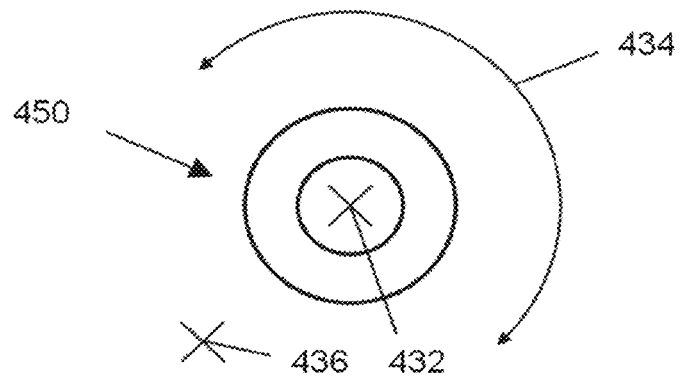
FIG. 4F illustrates possible movements in a schematic top view of the self-motile device shown in FIG. 4D.

Furthermore, by combining angular movement capabilities with the translational movement capabilities of the device, rotation can be achieved about any virtual rotation axis that is normal to the field plane in the x and y directions. FIG. 4F illustrates that the device 450 may be rotated clockwise and anti-clockwise, indicated by arrow 434 about the device's centre axis 432 or another arbitrary normal axis 436 outside of the device. Discrete steps of a few minutes of arc are typically achievable, with the size of the step controlled by the amplitude of the electrical signals applied. The speed of rotation can be controlled by adjusting the frequency of stepping, with maximum angular speeds of over 55 degrees/sec achievable. The device 450 may rotate or turn more than 360 degrees with the maximum angle of rotation limited by any attached cabling due to twisting.

Movement mechanisms based on other types of technologies can also be used, for example using magnetorestrictive materials, shape memory alloy, temperature differential actuators or electro-active polymers.

Figure 5:
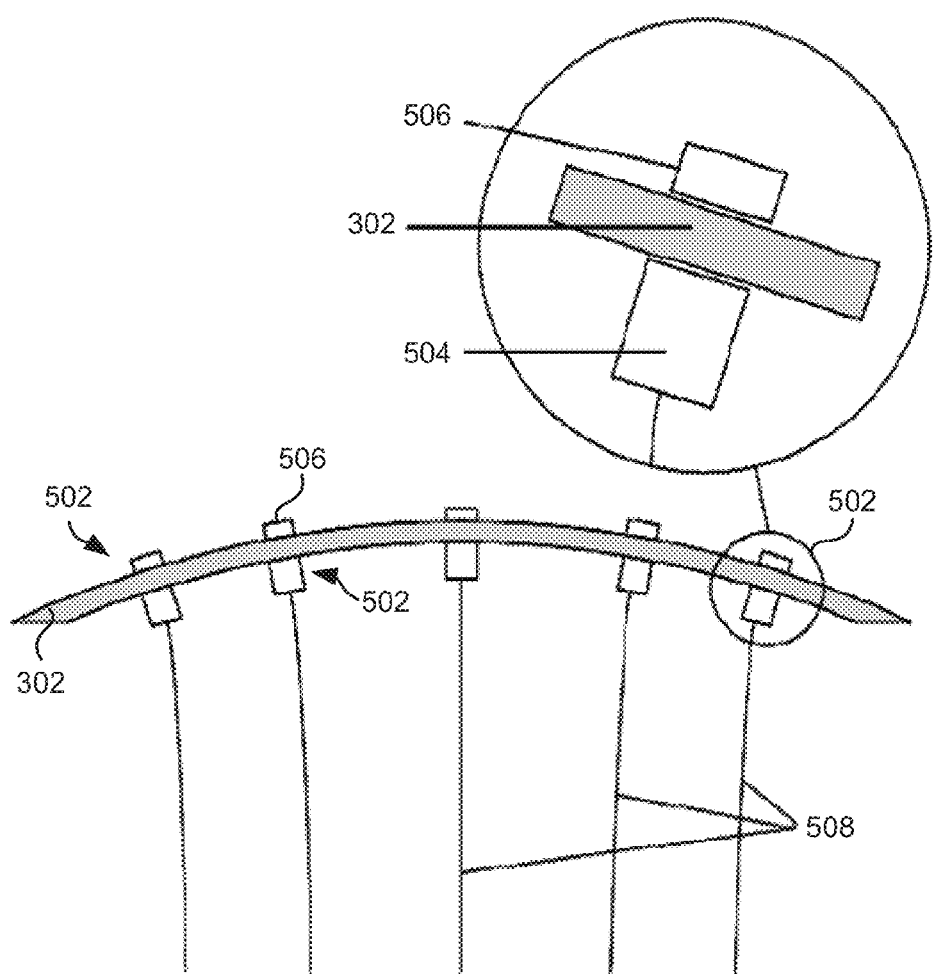
FIG. 5 is a schematic representation of an embodiment of self-motile devices used for positioning optical fibre.

One embodiment of a self-motile positioning device using this type of double-tube piezoelectric actuator is shown in FIG. 5. Positioning devices 502 have a metallic casing 504 with or without magnets and are anchored to the field plate 302 by a toroidal magnet 506 on the opposite side of the field plate. Magnets 506 can be any suitable shape such as C-shaped or nut-shaped as long as the magnets include an aperture allowing light to pass through to the respective fibres 508. Starlight enters through the toroidal or ring shaped magnet 506 and is then guided by the fibre 508 to provide an input to a spectrograph (not shown). Multiple positioning devices 502 can simultaneously reposition themselves and move at a rate of approximately 0.5 mm/s to provide configuration times in the order of minutes.

The configuration of a magnetic device hanging below a thin glass plate with a ring magnet above the plate to provide adhesion has a number of advantages such as no retractors being required. Furthermore, there are no fibres crossing the focal plane making it possible for a large number of positioning devices to be deployed. However, an additional requirement for this type of configuration is that the glass of the field plate 302 must be sufficiently thin for the magnetic anchoring to work efficiently. A special coating may be used on the glass to facilitate movement during repositioning.

Figure 6:
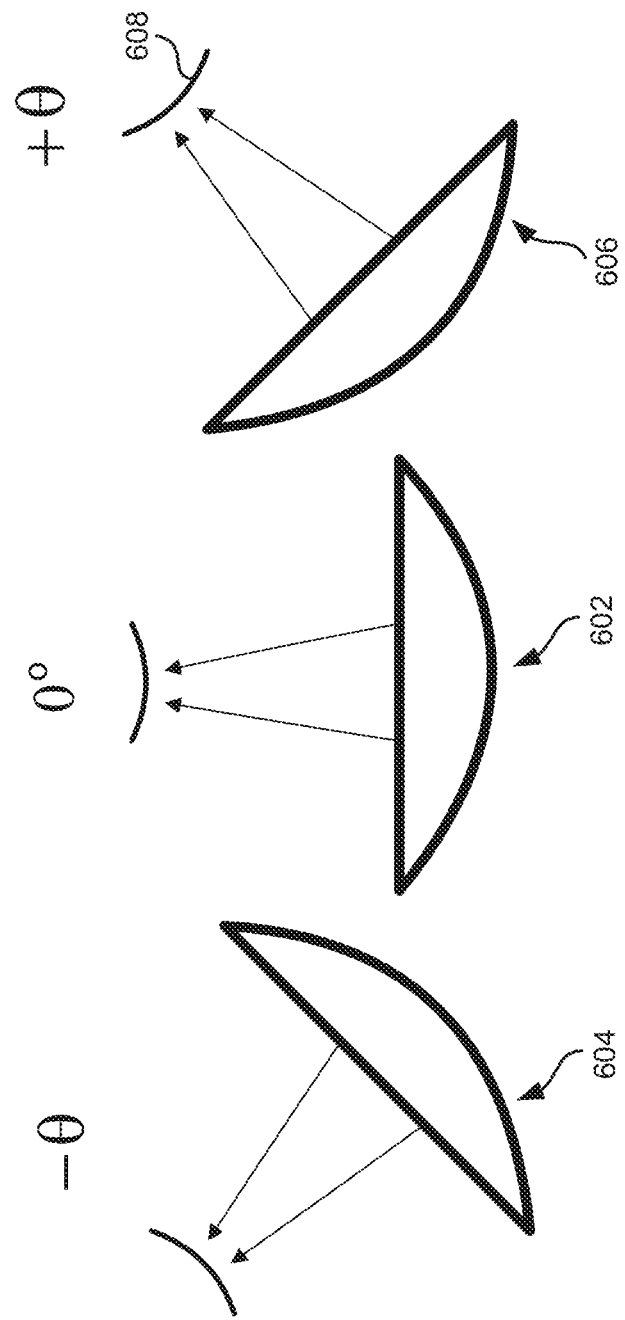
FIG. 6 is a schematic diagram illustrating various positions of a large telescope as the telescope tracks astronomical objects.

Referring to FIG. 6, a schematic representation of a telescope 602 in an upright position is shown, designated by a tilt angle of 0°. However, as the telescope tracks astronomical objects it is able to tilt through a range from −θ as shown by tilted telescope 604 to +θ as shown by tilted telescope 606, where −θ=−90° and +θ=90°. Consequently the field plate 608 of the telescope will tilt so that the magnet configuration described above with reference to FIG. 5 could result in the fibre end points (each weighing approximately 0.8-2.5 grams) slipping across the field plate 302 at high angles because there is not sufficient grip between the magnetically anchored devices 502 and the field plate 302. This is especially true if the field plate 302 includes a hard and slippery coating to facilitate the movement of the positioning devices across the field plate 302.

Figure 7:
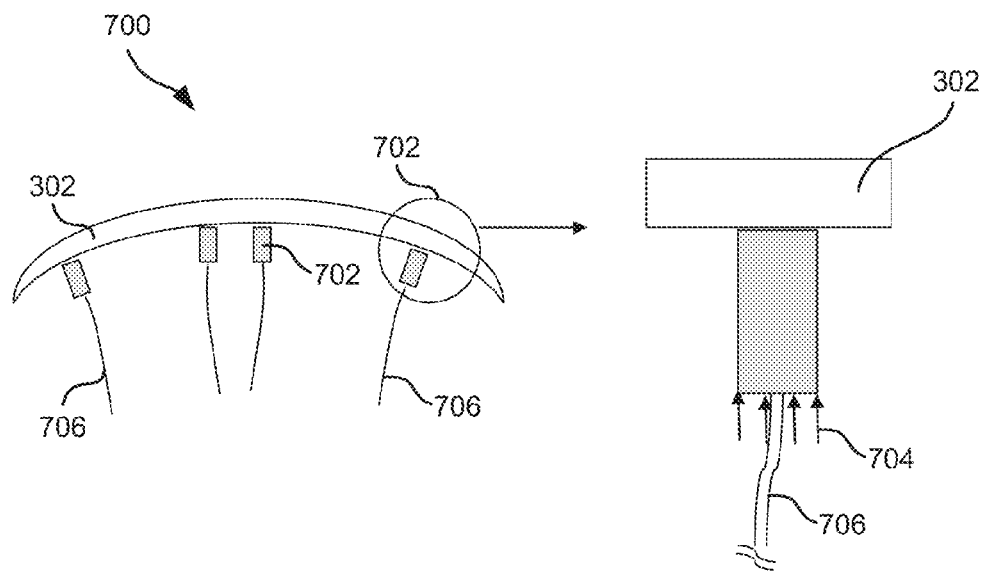
FIG. 7 is a schematic diagram of a fibre positioning device according to an embodiment of the invention.

To address the possibility of the positioning devices slipping, FIG. 7 illustrates an alternative configuration 700 of self-motile positioning devices 702 that do not make use of magnets to anchor them to the field plate 302. In this configuration suction or reduced pressure between the device 702 and the field plate 302 results in a force (represented by arrows 704) that helps the device 702 to "stick" to the field plate 302.

In one embodiment the reduced pressure is a reduced air pressure provided to the device 702 via a single cable 706 that includes both the optical fibre as well as tubing for extracting air and effecting reduced pressure between the device 702 and the field plate 302. However, the fibre and tubing need not be housed in a single cable but may lead to the device 702 separately.

The tubing has to be sufficiently robust to withstand an inner reduction in pressure, and a tube with inner diameter 1 mm and outer diameter 1.5 mm is appropriate for interfacing with the positioning device. The tube length may be between 30 mm and 1000 mm depending on the overall telescope configuration. Material used for the tubing may include rubber, polytetrafluoroethylene (PTFE, commonly known as Teflon), silicon or other plastics. Metal tubing may also be used that has bellows at both ends that allow for bending or flexing.

Figure 8A:
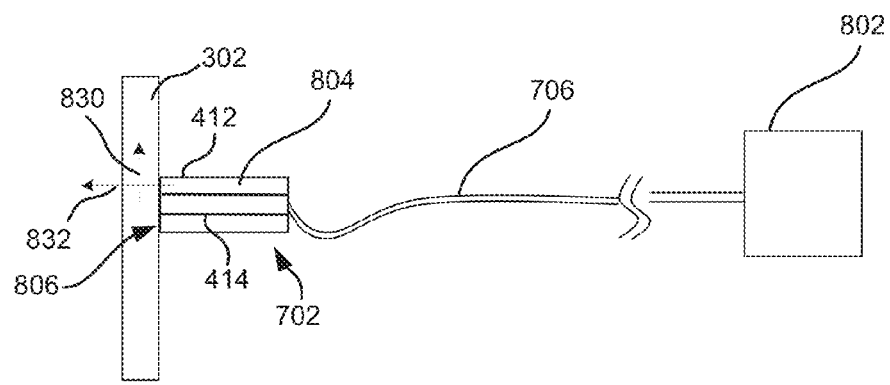
FIG. 8A is a further schematic diagram of the fibre positioning device of FIG. 7.

Referring to FIG. 8A, positioning device 702 includes an inner ceramic piezoelectric tube 414 and an outer tube 412 that together effect movement of the fibre end point. The area between the inner tube 414 and the outer tube 412 defines an enclosed or substantially enclosed volume inside a chamber 804 with an annular opening 806 that abuts, lies against or is held against the field plate 302. The reduced pressure in the chamber 804 that results in the suction that anchors the positioning device 702 to the field plate 302 is generated by suction means, in this case a pump system 802. The pump system 802 is used to reduce the pressure inside the chamber 804 so that the reduced pressure pulls the device 702 (together with the fibre end point therein) against the field plate 302.

The normal force 832 exerted by the anchored positioning device 702 on the field plate 320 is generated by the pump system 802. The normal force 832 together with the friction force 830 provides the total force overriding the gravitational force on the positioning device to anchor the positioning device to the field plate 320 through the range of movement of the telescope. The pressure difference provided by the pump system 802 is in the range of 0.1-1.0 Bar.

Figure 8B:
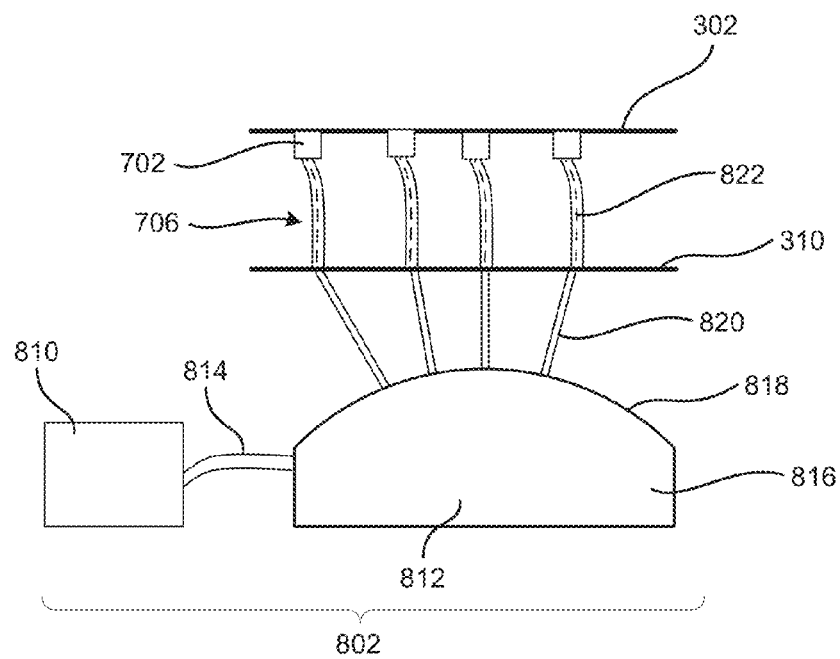
FIG. 8B is a schematic diagram of the pump system shown in FIG. 8A.

The pump system 802 includes a pump 810 (also called a vacuum generator) leading to a holding tank providing a vacuum buffer 812 with a buffer volume via pump output 814 as shown in FIG. 8B. Suitable pumps include rotary vane, scroll pumps, liquid ring pumps, plunger pumps, Wankel pumps, screw pumps, diaphragm pumps, cylinder pumps and Lobe pumps. An ejector based vacuum unit based on pressurized air may also be used.

Figure 9A:
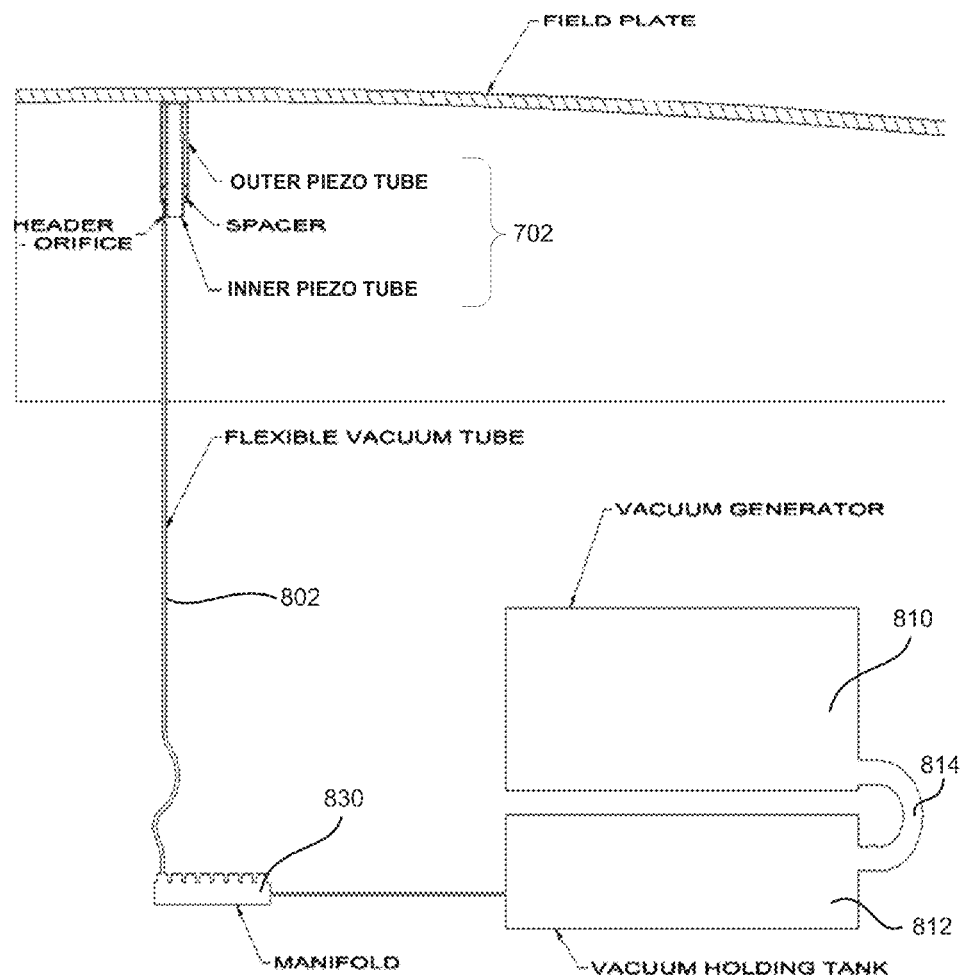
FIG. 9A shows a schematic diagram of a vacuum pump system according to an embodiment of the invention.

The buffer 812 provides a reduced pressure chamber 816 and consists of a vessel made of glass or plastic or other suitable material with an internal volume of 1 to 1000 liters. The buffer 812 has a dual function. The buffer 812 provides a backup system for maintaining a reduced pressure to anchor the positioning devices 702 on the field plate 302, for example in the case of a pump or power failure, or so that the positioning devices remain lying against the field plate 302 during repositioning. The buffer 812 also provides an extended surface 818 for interfacing the tubing 820 required for the positioning devices 702 to the pump 802. The extended surface may be provided in the form of a manifold such as an 8-way manifold 830 as shown in FIG. 9A. The manifold is custom made and includes a plate with holes evenly separated from each other to create a certain patrol range typically millimeters to tens of millimeters apart.

The about 0.6 m long individual vacuum tubes 820 have an internal diameter of at least 1 mm. A 1.8 mm silicon tube is used and the weight of each tube is just over 1 gram. A different type of material may be used that has appropriate stiffness and surface properties. The tubing 820 leading from the vacuum buffer 812 is bundled with the respective fibres 822 at the harness plate 310 to form cables 706 that in turn lead to the positioning device 702 at the field plate 302. A path provided by tube 820 then leads into the chamber 804 of each positioning device to enable a reduction in pressure in the substantially enclosed volume inside the respective chamber thereby anchoring the respective positioning device to the field plate.

In further arrangements the system may have a segmented buffer 812 or several buffers in parallel, where each buffer segment or each of the individual buffers is associated with a respective set of positioning devices. The buffers may share a common pump or may have respective pumps.

Figure 9B:
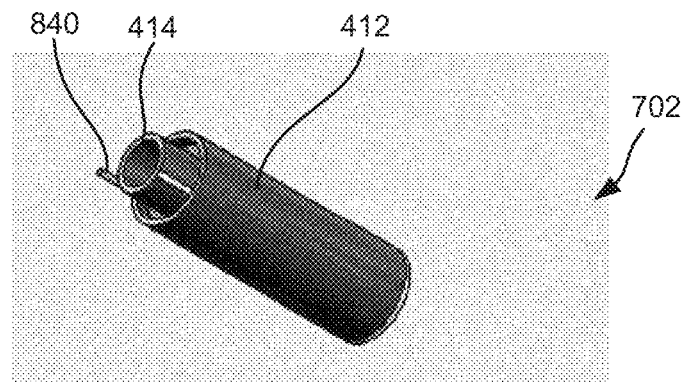
FIG. 9B shows a side perspective view of a positioning device.
Figure 9C:
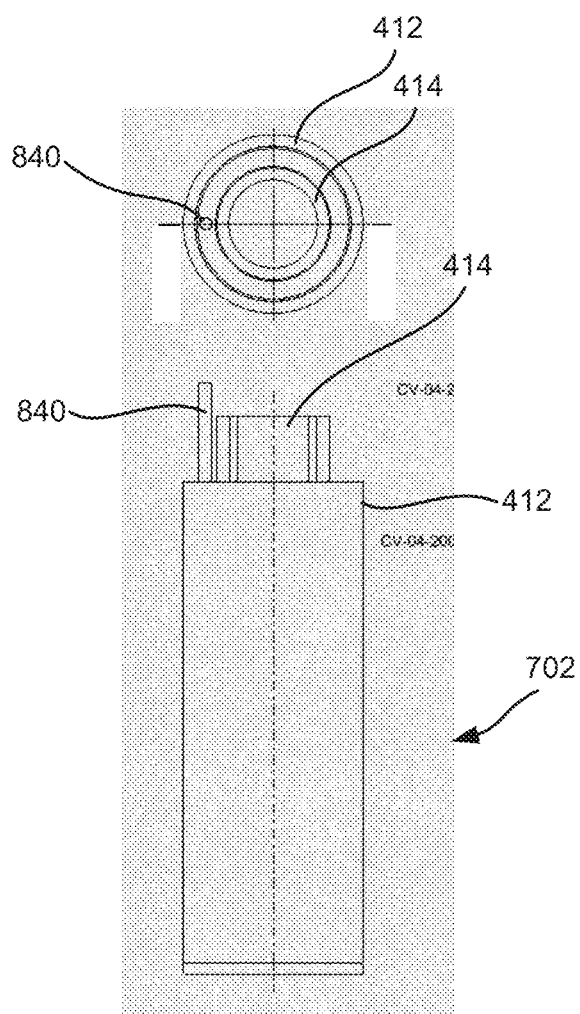
FIG. 9C shows a side and top view of the positioning device of FIG. 9B.

Referring to FIGS. 9B and 9C a positioning device 702 is shown that interfaces with the pump system 802 as described above. The inner tube 414 has an outer diameter of 3.0-3.4 mm, an inner diameter of 2.0-2.4 mm, and a length of 20-35 mm. The outer tube 412 has an outer diameter of 6.0-7.0 mm and an inner diameter of 4.0-5.5 mm. The weight of the device is 1-3 grams. The vacuum port 840 at the top of the positioning device 702 is a 0.5 mm needle. This fits within dimensional constraints of the positioning device 702. Reduced pressure is applied to the chamber 804 between the outer 412 and the inner 414 tubes. The narrow port 840 that enters the positioning device 702 acts as a flow restricting orifice that prevents a rapid loss of vacuum in the system when one or more of the positioning devices get detached from the field plate 302. At the same time the flow is adequate to prevent a vacuum loss in the positioning device 702 through the leaks resulting from the normal operation as proven by tests.

Figure 10A:
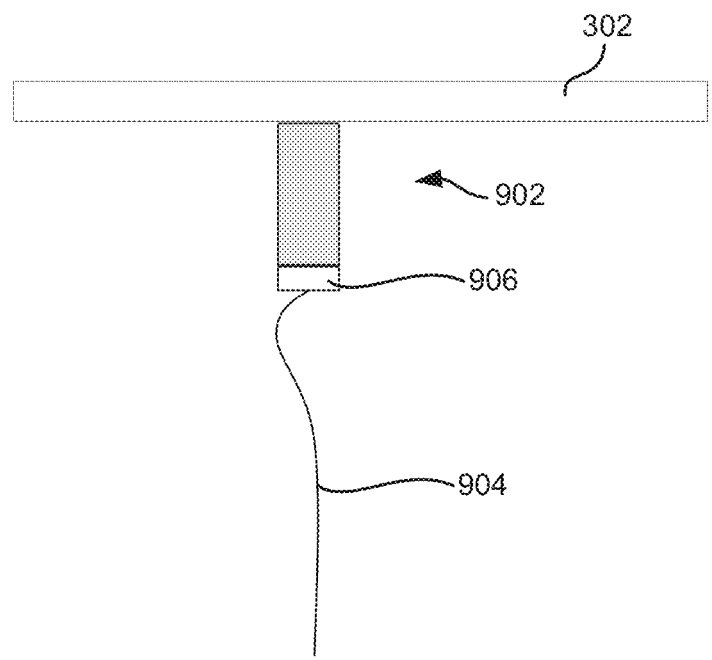
FIG. 10A is a schematic diagram of another embodiment of the invention.

Referring to FIG. 10A, a self-motile positioning device 902 is shown that anchors the end point of the fibre against the field plate 302 using a miniature individual pump 906. In this embodiment, each positioning device 902 has its own miniature pump 906 thereby reducing the overall weight and size of the instrument and eliminating the use of tubing between positioning devices and a remote pump. Instead of feeding the relatively bulky tubing along with the fibre, only the wiring used for the positioning control of the positioning device (and wiring for pressure and/or optical sensors if included) is provided with the fibre, so that cable 904 is less bulky than cable 706 shown in FIG. 7.

Figure 10B:
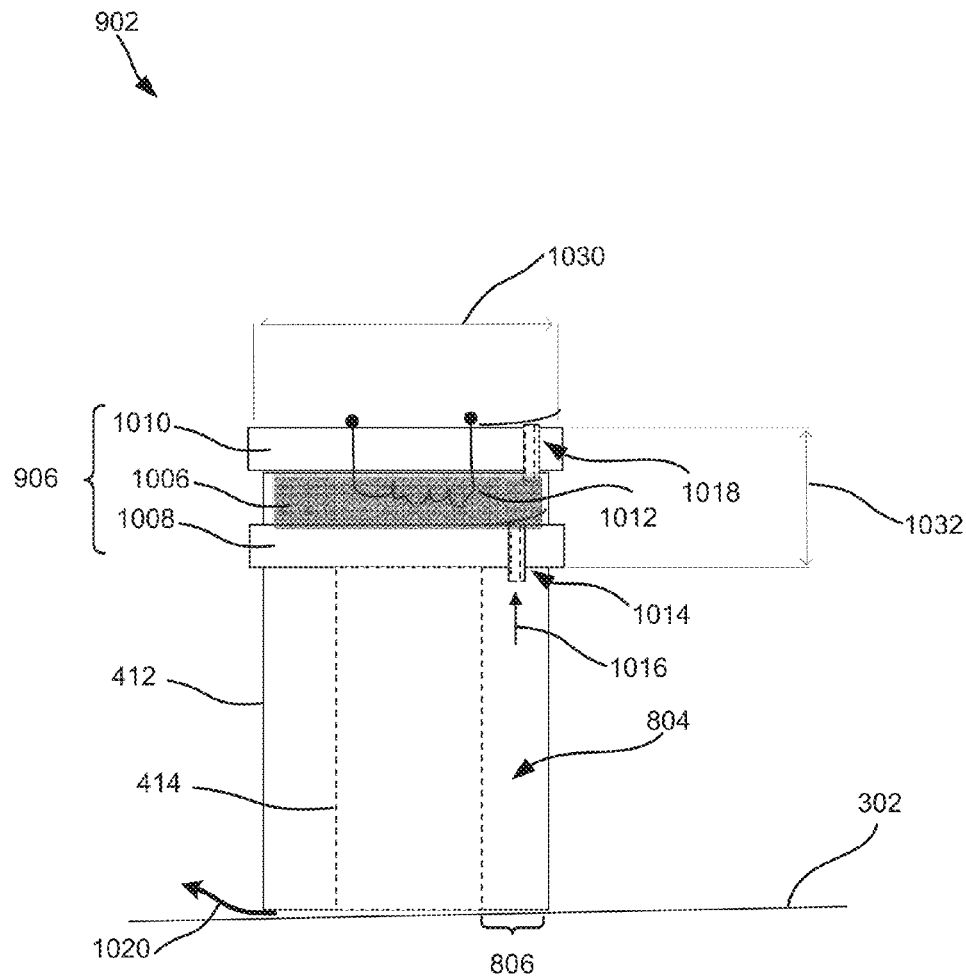
FIG. 10B is a further schematic diagram of the fibre positioning device of FIG. 9.

Referring to FIG. 10B, positioning device 902 includes an inner ceramic piezoelectric tube 414 and an outer tube 412 that together effect movement of the fibre end point. The area between the inner tube 414 and the outer tube 412 defines a chamber 804 with an annular opening 806 that abuts, lies against or is held against the field plate 302. The miniature pump 906 is used to reduce the pressure inside the chamber 804 so that the reduced pressure pulls the device 902 together with the fibre end point against the field plate 302. The miniature pump 906 has a generally toroidal shape so that the fibre (not shown) can pass through the pump and into the inner tube 414 so that the fibre end point (together with an associated micro lens array if used) can lie against or close to the field plate 302.

The miniature pump 906 includes a heat chamber 1006 with an actuator interfacing wall 1008 and an air interfacing wall 1010, both walls may be made of metal such as aluminium, or alternatively of a heat insulating material such as glass or ceramic. A heat element 1012 such as a heat coil made of a resistor is provided that lies within the heat chamber 1006 and is used for heating the air inside the heat chamber 1006 in order to reduce the pressure in the heat chamber through the following steps:

1. First, the heat coil 1012 heats the air in the heat chamber 1006 so that the air expands and some air pushes through one way valve 1018.
2. When the heat coil 1012 is subsequently turned off the air in the chamber 1006 cools down and the pressure is now reduced due to the air that escaped through one way valve 1018.
3. This reduction in pressure results in air moving from chamber 804 through the path via one way valve 1014 into the heat chamber 1006 thereby resulting in a reduction in pressure in chamber 804 and consequently facilitating the anchoring of the positioning device against the field plate.

Because the fibre end point and positioning device lie substantially flush against the smooth surface of the field plate 302, leakage air (represented by arrow 1020) is minimal Consequently the pressure difference to anchor each device is provided by pumping less than 10 liters per minute, for example 1 liter per minute or 0.1 liter per minute. This may be achieved by the heat element 1012 providing a power between 1 mW and 1 W. The miniature pump 906 has a diameter 1030 of 1.5-2.5 mm, a height 1032 of 8-12 mm and weighs between 1 and 3 grams.

The embodiments described above with reference to FIGS. 7 to 10 that use a reduction in pressure to anchor the positioning devices to the field plate 302 do not only have the advantage that they are relatively insensitive to gravity orientation, but they also have the advantage that less scratching or other damage results on the surface of the field plate 302 when the fibre end points are repositioned than, for example, is the case where magnetically anchored positioning devices drag their anchors across the field plate. Furthermore, because the power required to reposition is less (because the force used to anchor is not as high as for magnetic anchoring) there is less power consumption and heat dissipation when fibre end points are repositioned. Furthermore, without a magnet on the opposite side of the field plate 302 drag force is reduced.

Figure 11:
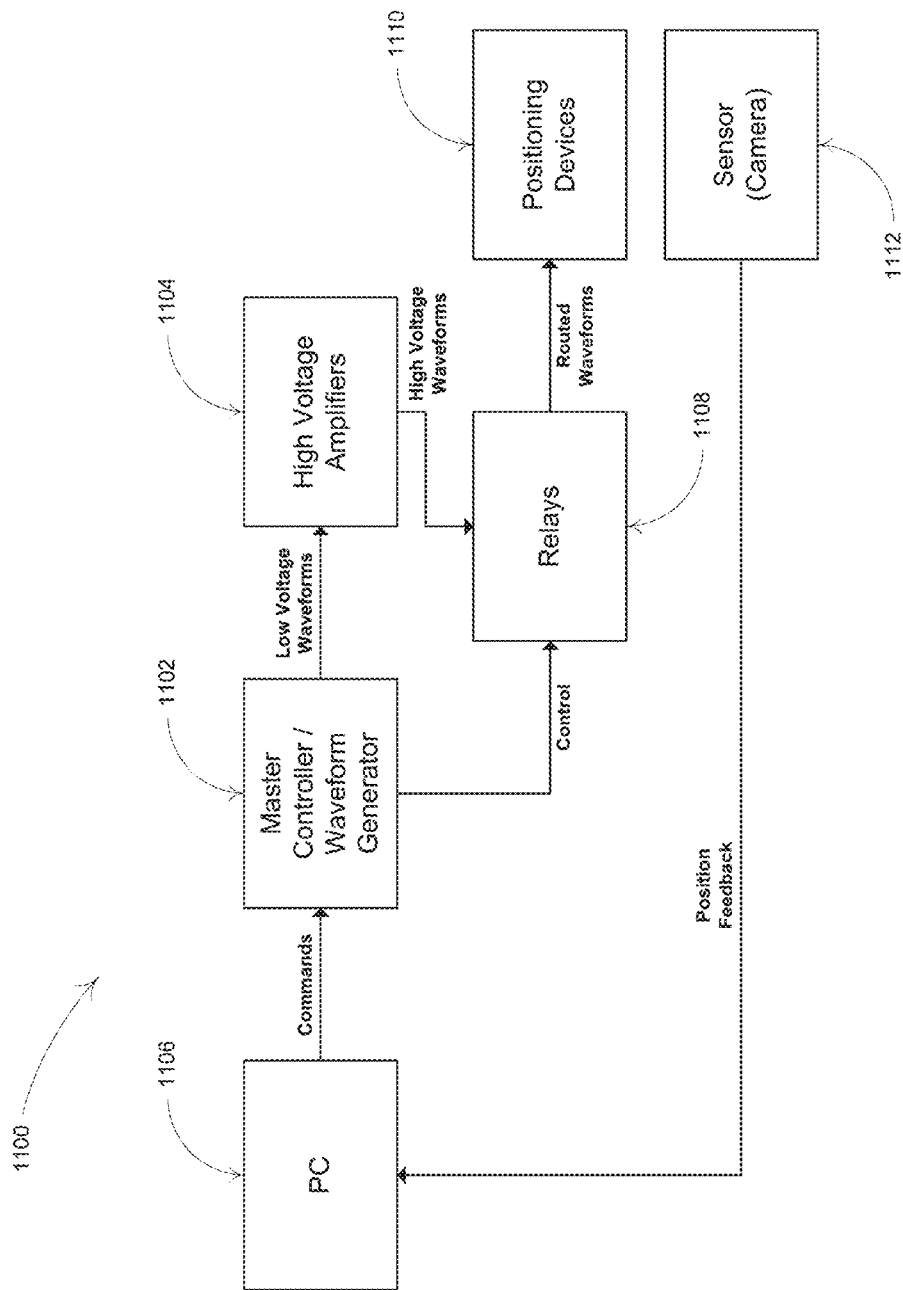
FIG. 11 is a schematic representation of control system hardware used to control the movement and anchoring of positioning devices.

FIG. 11 shows a block diagram of a control system 1100 used to control the positioning and anchoring of the positioning devices described above. The master controller and waveform generator 1102 uses a microcontroller and digital-to-analogue converters to produce the driving waveforms for the positioning devices at a specified frequency. Signal conditioning and pre-amplification is also applied at this stage. Low voltage waveforms from generator 1102 are fed into high voltage amplifiers 1104, and are output to relays 1108. The switching of the relays 1108 is managed by a dedicated microcontroller which is controlled by the master controller and waveform generator 1102 (via a serial communications protocol such as SPI). Commands to control the waveforms and relays are sent to generator 1102 from a processor 1106 (which may be a standard PC, for example) via a serial communications protocol such as RS-232. The switching of the high voltage waveforms to the electrodes of the positioning devices 1110 is performed by the relays 1108. Solid state relays are typically used for this task. The spatial position of the positioning devices is measured with a sensor 1112, such as a calibrated high resolution machine vision camera. Metrology and processing of control information are performed by custom-built real-time software running on the PC. The control system 1100 is used to accurately position the positioning devices on the field plate of the telescope at specified locations. This is achieved through closed-loop feedback from the sensor 1112.

Figure 12:
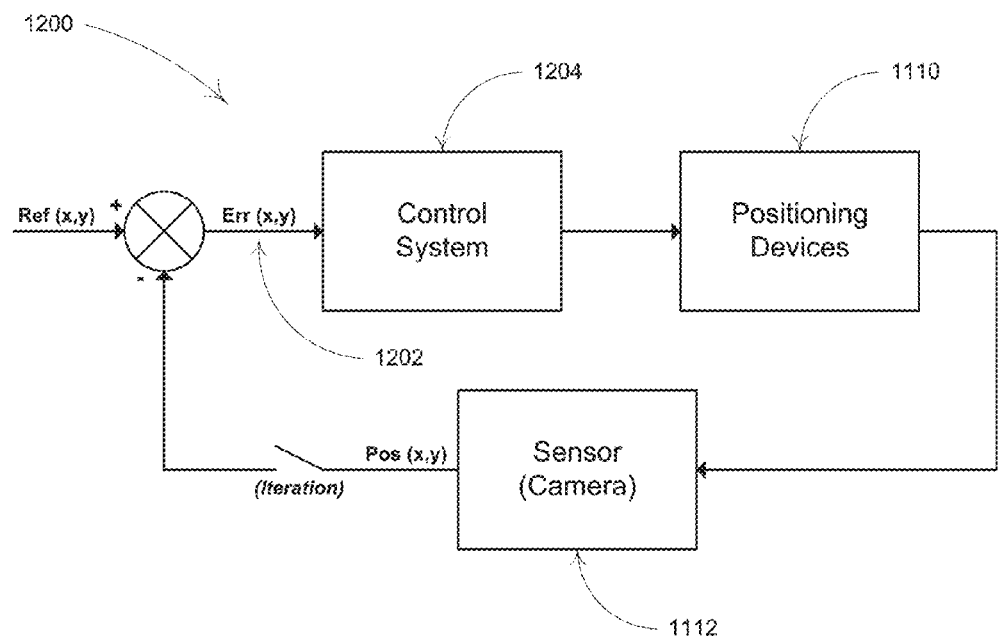
FIG. 12 is a schematic representation of a control system model for positioning and anchoring positioning devices.

FIG. 12 is a schematic representation of a control system model 1200 for positioning and anchoring positioning devices. A closed-loop positioning system is used because of small intrinsic variations between the positioning devices and susceptibility to external disturbances. To begin, a spatial location, Ref (x,y), is defined as the desired final position for a positioning device. The objective is to close the loop by iterating and integrating, to minimize the positional error 1202, Err (x,y), of the actual position Pos (x,y) with reference to the desired position Ref (x,y). The control system 1204 is able to position multiple positioning devices in this way simultaneously or substantially simultaneously. In the model 1200 the control system 1204 includes the PC 1106, master controller and waveform generator 1102, high voltage amplifiers 1104 and relays 1108, as described above with reference to FIG. 11. The positioning and anchoring of positioning devices 1110 is measured by a sensor 1112 (such as a camera), thereby providing feedback in the closed loop control system. Furthermore, the control system 1204 may also provide feedback regarding the angular position of the positioning devices for positioning each device in a desired angular and translational position.

It will be understood that the invention disclosed and defined in this specification extends to all alternative combinations of two or more of the individual features mentioned or evident from the text or drawings. All of these different combinations constitute various alternative aspects of the invention.

What is claimed is:

1. A positioning system for anchoring a fibre end point at a location on a telescope field plate collocated with a telescope focal plane, the positioning system comprising:
   a piezoelectric positioning device for positioning the fibre end point, the positioning device comprising a chamber having an opening, the opening lying against the field plate in use defining a substantially enclosed volume inside the chamber;
   a pump for reducing pressure inside the enclosed volume; and
   a path connecting the pump and the enclosed volume so that, in use, the pump effects a reduction in pressure in the chamber thereby anchoring the fibre end point on the field plate.

2. The positioning system of claim 1 wherein the piezoelectric positioning device comprises two concentric piezoelectric cylinders and the chamber lies between the two cylinders.

3. The positioning system of claim 1 wherein the piezoelectric positioning device comprises one piezoelectric cylinder and the chamber lies within a wall of said cylinder.

4. The positioning system of claim 1 wherein the pump comprises a vacuum pump for removing gas molecules from the enclosed volume thereby reducing pressure in the chamber.

5. The positioning system of claim 4 wherein the pump further comprises a vacuum buffer functionally located between the vacuum pump and the path so that the path interfaces with the pump via the vacuum buffer.

6. The positioning system of claim 1 wherein the path comprises tubing leading from the pump into the enclosed volume.

7. The positioning system of claim 1 wherein the piezoelectric device is further configured for angularly positioning the fibre end point.

8. The positioning system of claim 1 wherein the pump comprises:
   a heat element for heating air in the pump;
   a first one way valve; and
   a second one way valve;
wherein, in use, heating and subsequently cooling the heat element enables a movement of air through the first and second valves thereby reducing pressure in the chamber.

9. A positioning system for anchoring multiple fibre end points at specified locations on a telescope field plate collocated with a telescope focal plane, the positioning system comprising:
   a plurality of piezoelectric positioning devices for positioning respective fibre end points, each of the respective devices comprising:
      a chamber comprising an opening, the opening lying against the field plate in use defining a substantially enclosed volume inside the chamber; and a suction generator for reducing pressure inside the enclosed volume thereby anchoring the fibre end point on the field plate.

10. The positioning system of claim 9 further comprising a control system for controlling movement of the positioning devices.

11. The positioning system of claim 10 wherein the control system controls the movement of more than one of the positioning devices substantially simultaneously.

12. The positioning system of claim 10 wherein the movement of the positioning devices includes translational movement.

13. The positioning system of claim 10 wherein the movement of the positioning devices includes angular or rotational movement.

14. The positioning system of claim 13 wherein the angular or rotational movement includes angular or rotational movement about an axis normal to the field plate.

15. A method for anchoring a fibre end point at a location on a telescope field plate collocated with a telescope focal plane, the method comprising:
positioning a fibre positioning device against the field plate; and
reducing pressure in an enclosed volume inside the fibre positioning device thereby anchoring the fibre end point against the field plate.

16. The method of claim 15 further comprising the step of maintaining a reduced pressure in the enclosed volume when repositioning the fibre end point so that the fibre end point remains lying against the field plate during repositioning.

17. A self-motile positioning device for locating an optical sensor assembly at a location on a telescope field plate, the device comprising:
an input to the optical sensor assembly;
a piezoelectric actuator to move the positioning device;
a housing comprising the input to the optical sensor assembly and the piezoelectric actuator, the housing comprising a chamber with an opening that in use is held against the field plate to define an enclosed volume; and
a suction generator to reduce a pressure in the chamber and thereby hold the positioning device against the field plate.

18. The self-motile positioning device of claim 17 where the optical sensor assembly includes any one or more of a fibre end point, a lens or lens assembly and an optical sensor.

* * * * *